United States Patent [19]

Kuke et al.

[11] Patent Number: 5,566,264

[45] Date of Patent: Oct. 15, 1996

[54] LASER MODULE INCLUDING GROOVED SILICON SUBSTRATE, ISOLATOR AND OPTICAL FIBER

[75] Inventors: Albrecht Kuke, Auenwald; Eberhard Moess, Murrhardt, both of Germany

[73] Assignee: ANT Nachrichtentechnik GmbH, Backnang, Germany

[21] Appl. No.: 519,663

[22] Filed: Aug. 25, 1995

[30] Foreign Application Priority Data

Sep. 2, 1994 [DE] Germany ............... 44 31 285.7

[51] Int. Cl.⁶ .................. G02B 6/30; H01S 3/08
[52] U.S. Cl. .................. 385/49; 385/11; 385/14; 385/15; 385/52; 385/88; 385/92; 385/94; 372/108
[58] Field of Search ............... 385/11, 14, 15, 385/31, 33, 38, 49, 52, 88, 92, 94, 139; 372/43, 50, 106, 107, 108, 109

[56] References Cited

U.S. PATENT DOCUMENTS

| | | | |
|---|---|---|---|
| 4,199,222 | 4/1980 | Ikushima et al. | 385/92 X |
| 4,746,191 | 5/1988 | Kawakami et al. | 385/11 X |
| 4,802,727 | 7/1989 | Stanley | 385/88 X |
| 4,973,120 | 11/1990 | Jopson et al. | 385/11 X |
| 5,074,682 | 12/1991 | Uno et al. | 385/93 |
| 5,113,404 | 12/1992 | Gaebe et al. | 372/36 |
| 5,216,737 | 6/1993 | Driessen et al. | 385/93 |
| 5,325,456 | 6/1994 | Cullen et al. | 385/138 |
| 5,416,869 | 5/1995 | Yoshino | 385/88 |

FOREIGN PATENT DOCUMENTS

| | | | |
|---|---|---|---|
| 0259888 | 12/1993 | European Pat. Off. | 385/92 X |
| 4422322 | of 0000 | Germany | 385/92 X |
| 4232327 | 3/1994 | Germany | 385/92 X |

*Primary Examiner*—Brian Healy
*Attorney, Agent, or Firm*—Michael J. Striker

[57] ABSTRACT

The laser module couples its semiconductor laser to an optical device, e.g. an optical fiber, particularly a monomode fiber. The laser module includes a micromechanically structured silicon substrate (31) provided with an elongated groove (30) having a longitudinal axis by an anisotropic etching technique; a semiconductor laser (110) mounted on the silicon substrate (31) to emit light parallel to the longitudinal axis of the elongated groove; an optical coupling device including an isolator (10) positioned on the silicon substrate (31) so that light from the semiconductor laser (110) passes therethrough and a sealed housing (50) inside of which the silicon subtrate (31), the semiconductor laser (110) and the isolator are contained. At least a portion of the optical components mounted in the elongated groove and not rotationally symmetrical with respect to forward light transmission properties are each provided with at least one flat edge surface (210,210') bearing on an anisotropically etched wall of the elongated groove (30).

9 Claims, 2 Drawing Sheets

LASER MODULE INCLUDING GROOVED SILICON SUBSTRATE, ISOLATOR AND OPTICAL FIBER

BACKGROUND OF THE INVENTION

The invention relates to a laser module, in particular for coupling to an optical fiber, having a semiconductor laser in a housing and having an isolator.

Such laser modules are disclosed in EP 02 59 888 B1 and DE 42 32 327 A1. Both publications describe a laser on a chip carrier whose light is collimated using a first lens and penetrates the housing wall via an obliquely positioned flat aperture. The housing is sealed hermetically tight in this case by the flat aperture. Outside the housing, the light is focused onto the end face of an optical fiber by a second lens. Additionally described in the second publication is an isolator which is seated outside the hermetically enclosed volume in a stub which projects into the housing and carries the aperture at its end.

DE 44 22 322.6 discloses a laser module having a silicon substrate which is micromechanically structured by means of an anisotropic etching technique. A first lens and an isolator are inserted into a first groove. A monitor diode is located in a second groove. The semiconductor laser is mounted on the web between the grooves.

If a laser diode is to be used for very high transmission rates or bit rates, it is necessary to keep retroreflected radiation away from the laser diode. The retroreflections can be produced both at the coupling optical system required for the optical coupling between the laser diode and the fiber, and on the fiber link itself (plug-in contacts, splices). The reflections at the coupling optical system are avoided according to the prior art by providing that the optical surfaces are coated with an antireflection coating and/or installed obliquely with respect to the beam path. The retroreflections from the fiber link cannot be eliminated by these measures. According to the prior art, an optical isolator is used for this purpose. Such an optical isolator consists of a first polarizer, an optical crystal having the Faraday effect in a static magnetic field which rotates the plane of polarization of the light by 45°, and of a second polarizer, whose direction of polarization is rotated by 45° with respect to that of the first polarizer. In the forward direction, after rotating by 45° with its plane of polarization parallel to the direction of polarization of the second polarizer, the light linearly polarized in the first polarizer impinges on said second polarizer and is therefore virtually not attenuated. In the opposite direction, the reverse direction, the rotation by 45° has the effect that the light linearly polarized by the second polarizer impinges on the first polarizer rotated by 90° with respect to the direction of polarization of the latter, and is therefore blocked. The optical paths (dotted arrows) and the directions or rotations of polarization (continuous arrows, the angle of polarization having been projected into the plane of the drawing in each case) are illustrated in FIG. 1 for the forward direction (upper row of arrows) and reverse direction (lower row of arrows). In order to achieve low forward attenuation and high reverse attenuation which are important for use, in addition to a high quality of the polarizers and of the Faraday rotator there is a need for a very exact azimuthal alignment of these components relative to one another. In order to protect an isolator against environmental influences, it is necessary, according to the prior art, for all the optical components of the isolator to be jointly sealed hermetically tight in a cylindrical metal housing. The overall size of the entire isolator must be so small in this case that it fits into the microoptical beam path required for the laser coupling. According to the prior art, an outside diameter of 3 mm and a length of 4 mm are customary for this purpose. In the case of mounting the finished isolator in a laser transmitter module, it is necessary to carry out exact azimuthal alignment of the isolator relative to the plane of polarization of the laser diode. This means an additional adjusting step in mounting the laser.

SUMMARY OF THE INVENTION

It is the object of the present invention to provide a laser terminal module which is of particularly simple design and has an isolator which is easy to mount.

This object is attained by the arrangement having the features of the main claim. Advantageous developments are specified in the subclaims.

BRIEF DESCRIPTION OF THE DRAWING

The objects, features and advantages of the present invention will now be illustrated in more detail by the following detailed description, reference being made to the accompanying drawing in which.

DESCRIPTION OF THE PREFERRED EMBODIMENTS

Figure 1:
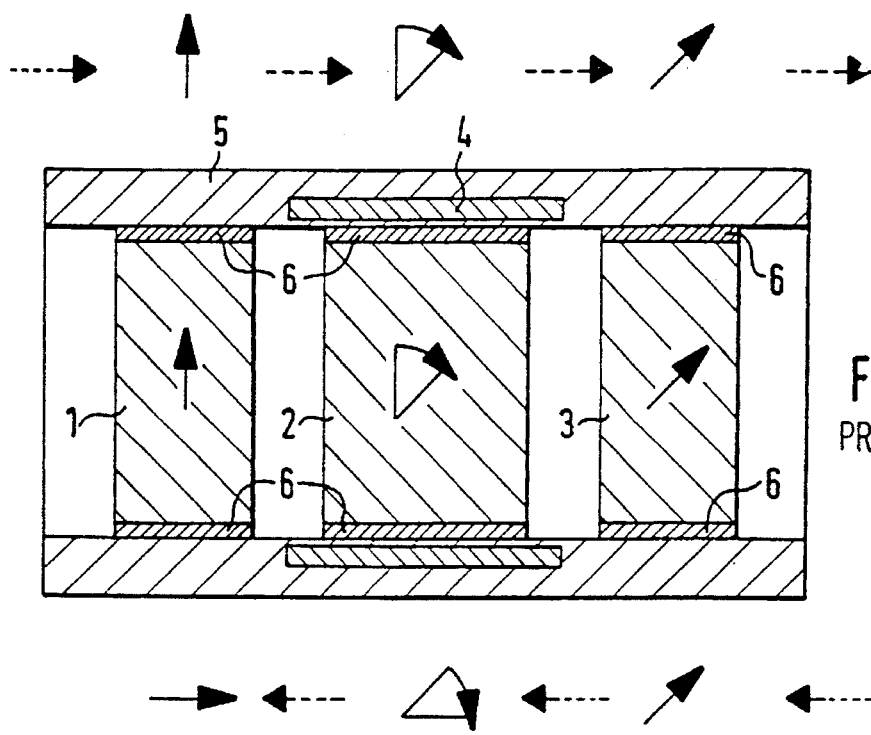
FIG. 1 is a longitudinal cross-sectional view through isolator in accordance with the prior art.

The isolator shown in FIG. 1 has a first polarizer 1, a Faraday rotator 2 with an annular permanent magnet 4, and a second polarizer 3. These components are jointly installed in a hermetically tight fashion in a cylindrical housing 5 via soldered connections 6. In this type of mounting, it is very cost intensive to align the individual components azimuthally relative to one another with high precision and to solder them hermetically tight.

Figure 2:
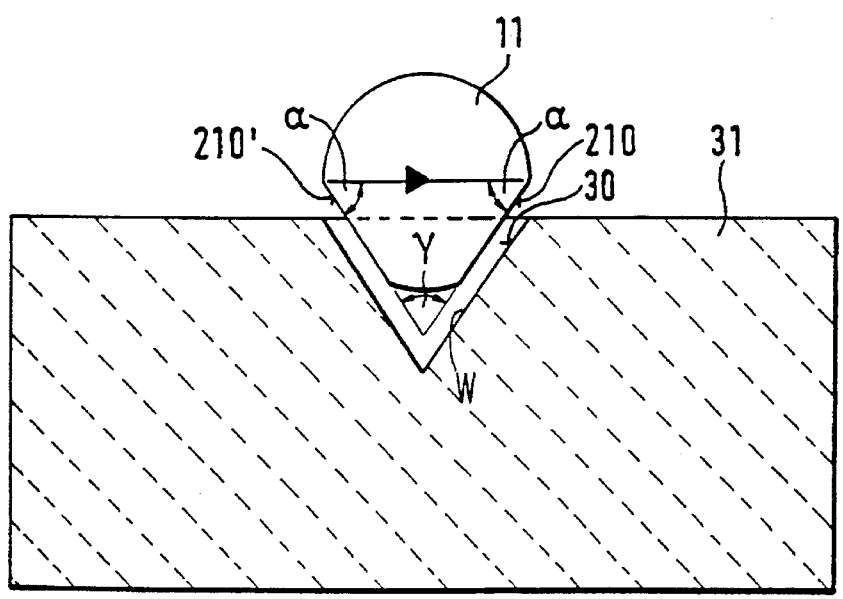
FIG. 2 is a cross-sectional view through a first polarizer in an isolator in accordance with the invention.

When the isolator is used upstream of a laser diode which must be mounted in a hermetically tight housing, there is no need for a hermetically tight encapsulation of the individual components of the isolator if they are accommodated in the same hermetically tight housing as the laser. The components of the isolator can be fixed much more simply and cost effectively using an adhesive. In order to align the components of the isolator azimuthally with high precision relative to one another, it is proposed that the components are provided with at least one flat face 210 at the edge. This flat face 210 has a fixed azimuthal angular relationship to the required azimuthal angular position of the respective isolator component. A first polarizer 11 with its plane 21 of polarization in the horizontal direction is represented by way of example in FIG. 2. The polarizer has two flat edge faces 210 and 210' which enclose an angle of $$\arctan(\sqrt{2}) = 54.74°$$

with the direction of polarization of the polarizer 11, with the result that the angle $\tau$ between the two faces 210 and 210' is $$\tau = 180° - 2 \cdot \alpha = 70.53°$$

Figure 3:
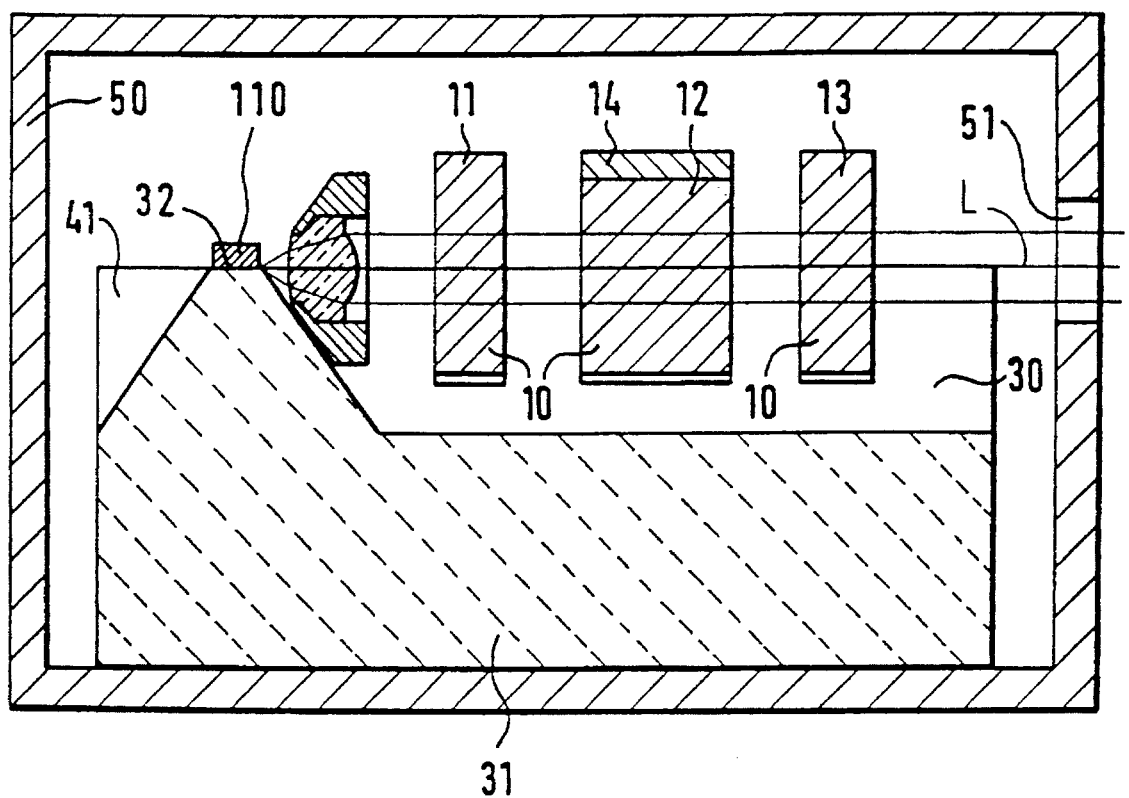
FIG. 3 is a cross-sectional view through one embodiment of the laser module according to the invention showing the V-groove.

These angles are produced when a V-groove is etched anisotropically in the <110>-direction in {100} orientated monocrystalline silicon. FIG. 3 shows a V-groove 30 in a silicon substrate 31 having a lognitduinal axis L. The polarizer 11 is now inserted into this V-groove with its flat edge face 210 bearing on the wall W of the V-groove so that a very exact azimuthal angular alignment being achieved. The other isolator components, the Faraday rotator 12 and the second polarizer 13, which are likewise provided in each case with flat edge faces 210 and 210' these edge faces in each case being aligned with the required azimuthal position which is required for the corresponding component, are mounted in the same way. The Faraday rotator is provided in this case with a permanent magnet 14 in the edge region.

It is a further advantage of the solution according to the invention that not only, as already mentioned, is it possible to dispense with the mutual azimuthal adjustment of the individual components relative to one another when producing the isolator, but that azimuthal adjustment, required according to the prior art, of the entire isolator relative to the plane of polarization of the laser is also eliminated.

Semiconductor lasers already emit a linearly polarized optical radiation whose plane of polarization is parallel to the active surface. If, now, the semiconductor laser 110 is mounted directly on the surface 32 or parallel thereto, there is a fixed angular relationship between the plane of polarization of the laser light and the alignment of the optical components of the isolator. This results in the elimination of azimuthal adjustment between the plane of polarization of the laser and the isolator, which is required according to the prior art. In the embodiment shown in FIG. 3 the laser light is emitted parallel to the longitudinal axis of the elongated groove 30.

It is, furthermore, even possible to omit the first polarizer 11 entirely. It is not necessary for the forward direction, since the laser light is already linearly polarized in any case. The polarizer 11 is also not required for the reverse direction. The reason for this is that in the reverse direction only light of which the plane of polarization is perpendicular to the plane of polarization of the laser falls from the Faraday rotator onto the laser. The light thus polarized does not, however, disturb the laser.

In addition to the isolator, still further optical components, which are required for the optical beam guidance, can be mounted free from adjustment in the same V-groove 30. Thus, for example, a collimation lens is fitted between the laser and the isolator. Given increased demands on the reverse attenuation, the isolator can likewise be extended in a simple way to form a two-stage isolator by adding a further Faraday rotator and polarizer. A groove 41 can likewise be anisotropically etched on the rear side of the laser, in order to accommodate a monitor diode (not shown here). In order to protect all the components against environmental influences in a hermetically tight fashion, the silicon substrate is installed with the electronic, electrooptic and optical components in a housing 50 which has on one outer face an aperture 51 through which the beam emerges. Outside, the beam is focused by means of a focusing lens, which can also replace the aperture 51, and launched into an optical fiber (not shown here). In order to avoid direct retroreflections at the interfaces of the optical components, the latter can, as known according to the prior art, be provided with antireflection coatings and/or be inclined relative to the beam path.

We claim:

1. A laser module comprising a micromechanically structured silicon substrate (31) provided with at least one elongated groove (30) by means of an anisotropic etching technique, said silicon substrate (32) having a surface (32) and said at least one elongated groove (30) having a longitudinal axis and being bounded by an anisotropically etched wall of said silicon substrate (31);

a semiconductor laser (110) mounted on the silicon substrate (31) for emission of light parallel to the longitudinal axis of the at least one elongated groove;

an isolator (10) mounted on said silicon substrate (31) and positioned so that said light from said semiconductor laser (110) passes therethrough, said isolator (10) including a plurality of components inserted in said at least one elongated groove (30), wherein at least a portion of said components not rotationally symmetrical with respect to forward light transmission properties are each provided with at least one flat edge surface (210,210') bearing on the anisotropically etched wall of the at least one elongated groove (30); and a sealed housing (50) inside of which said silicon subtrate (31), said semiconductor laser (110) and said isolator are accommodated.

2. The laser module as defined in claim 1, wherein the components of the isolator (10) comprise a first polarizer (11), a Faraday rotator (12) and a second polarizer (13) rotated relative to the first polarizer (11).

3. The laser module as defined in claim 1, wherein the components of the isolator (10) comprise a Faraday rotator (12) and a polarizer (13), the polarizer (13) being arranged on a side of the Faraday rotator (12) opposite to a side on which the semiconductor laser is arranged and including means for passing a portion of said light whose plane of polarization is rotated by an angle of rotation of the Faraday rotator (12) with respect to a plane of polarization of said light emitted by said semiconductor laser.

4. The laser module as defined in claim 1, wherein the at least one elongated groove (30) is a V-groove.

5. The laser module as defined in claim 4, wherein all the components of the isolator (10) have two flat edge faces inserted into the V-groove and bearing on the silicon substrate.

6. The laser module as defined in claim 1, wherein additional optical devices are inserted into the V-groove (30).

7. The laser module as defined in claim 1, wherein the semiconductor laser (110) is mounted on the surface (32) of the silicon substrate (31).

8. The laser module as defined in claim 1, wherein the semiconductor laser (110) is mounted at one end of the at least one longitudinal groove (31).

9. The laser module as defined in claim 1, further comprising an optical fiber and means for optically coupling said semiconductor laser (110) and said optical fiber, said means for optically coupling including said isolator (10).

* * * * *